Figure 1A:
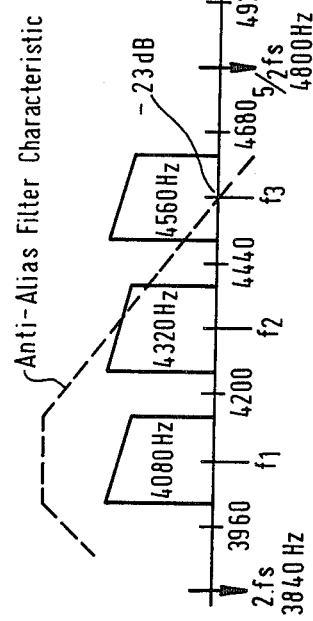

United States Patent [19]

Pilkington

[11] Patent Number: 4,777,605

[45] Date of Patent: Oct. 11, 1988

[54] METHOD AND APPARATUS FOR IDENTIFYING THE COMPONENTS OF A SIGNAL

[75] Inventor: Simon D. J. Pilkington, Oldland Common, England

[73] Assignee: Westinghouse Brake and Signal Company Limited, Chippenham, England

[21] Appl. No.: 882,054

[22] Filed: Jul. 3, 1986

[30] Foreign Application Priority Data

Sep. 16, 1985 [GB] United Kingdom ............... 8522845

[51] Int. Cl.$^4$ ............................................. G01R 23/00
[52] U.S. Cl. ..................... 364/484; 364/604; 364/726; 455/205; 358/281
[58] Field of Search ............ 364/484, 726, 604; 455/205, 213, 46, 47; 358/281; 375/45

[56] References Cited

U.S. PATENT DOCUMENTS 4,726,069 2/1988 Stevenson ........................ 455/46
4,730,257 3/1988 Szeto .............................. 364/484

Primary Examiner—Emanuel S. Kemeny
Attorney, Agent, or Firm—Nilsson, Robbins, Berliner, Carson & Wurst

[57] ABSTRACT

Fast Fourier Transform methods of analyzing signal frequencies spectra yield results from zero frequencies upwards. Thus, when the frequency band of interest is not at very low frequencies a lot of wasted calculations may be performed, and resolution and computation time have to be traded-off against each other, often falling short of the requirements for both. A technique is described in which the signal to be analyzed is passed through an anti-alias filter and initial transform data is collected by undersampling. In a railway track circuit receiver which is to identify a predetermined carrier frequency or FSK signal, the anti-alias filter is selected to exclude frequencies other than those in a frequency band including the particular track signal so that there is no ambiguity in the calculated transform results.

9 Claims, 3 Drawing Sheets

METHOD AND APPARATUS FOR IDENTIFYING THE COMPONENTS OF A SIGNAL

This invention relates to a method and apparatus for identifying the frequency components of a signal and, in particular, it concerns a method and apparatus of the type for performing a fast Fourier transform on real time series samples of the signal.

Techniques for performing discrete and fast Fourier transforms, and suitable algorithms for their calculation by machine, have been described at length in published literature, see for example:

"Communications of the ACM" (Vol. II, No. 10; October 1968) by G. Bergland and

"Mathematics of Computation 19" (April 1965) by Cooley-Tukey

Probably the greatest problem encountered in using Fourier techniques for signal analysis is caused by the length of time required to complete all of the necessary calculations. The fast Fourier transform, especially the Cooley-Tukey algorithm, has permitted substantial savings of time to be achieved in the computation process by eliminating unnecessary and useless calculations. It is inherent in the Fourier transform process that every transform cycle must involve calculations of frequency components commencing at zero in every instance. In effect this renders those calculations involving frequencies below the lowest present in the signal to be useless but nevertheless time consumming. The present invention has for one of its objects to reduce elapsed computation time before a useful result can be achieved in performing a Fourier transformation.

According to the present invention there is provided a method of analyzing a signal, for the purpose of identifying its frequency components, by performing a fast Fourier transform on real time series samples of the signal, including, in combination, the steps of filtering to exclude alias frequencies of the signal and sampling the filtered signal at a rate substantially lower than the minimum rate required to unambiguously identify the frequency of the signal.

The result of using this method is to "undersample" the modulated signal, that is the data samples collected are so relatively widely spaced that their values may be consistent with at least two harmonically related signal frequencies. The final effect is similar to that achieved by an heterodyning step and eliminating upper sideband frequencies.

The invention also provides apparatus for performing such a method, including means for evaluating a fast Fourier transform algorithm, and data collection means for obtaining real time series samples of a signal, which comprises an anti-alias filter having an output connected with digital sampling means operative to sample the filtered signal at a rate substantially lower than the minimum rate required to unambiguously identify the frequency of the signal.

The invention is useful in arrangements for identifying the modulation and carrier signal frequencies present in a received signal.

The computed result of the transform process consists of the calculated total power in each of a number of adjacent frequency spectrum elements or bins, each of finite width. The number of points in the algorithm employed by the transform together with the sampling rate determines frequency resolution and the upper frequency limit. Thus, any and all signal components having a frequency lying within a particular bin contribute to the total calculated power figure for that bin. However, the characteristics of the transform process give rise to a spreading effect so that a signal frequency component, in addition to its primary effect, produces perturbations in adjacent frequency bins. A "window function" such as a Hanning window function may be applied to the data samples before they are entered in a data memory for the first stage of the transformation. This has the effect of spreading the centre lobe of the spectrum, but reducing the side lobes. If a frequency coincides with the centre frequency of a transform results bin, there is no leakage into adjacent bins, but if the frequency is off-centre significant leakage occurs into either adjacent bin and the frequency off-set can be accurately calculated. In an Hanning window function each data sample is multiplied by a factor obtained from the corresponding part of a normalised cosine- squared function having a half period equal to the sampling collection period.

One form the invention is employed in a railway jointless track circuit receiver, the received signal being the track circuit signal. Each track circuit section is allocated a signal frequency, with no two adjacent sections having the same frequency, which signal is transmitted by the track circuit transmitter via the track rails. The transmitted signal is preferably modulated by a selected one of several predetermined code frequency signals. The coded signal may be received by a suitably equipped railway vehicle traversing the track section, in which case the signal is analysed by means of equipment described in the co-pending U.S. patent application Ser. No. 855,247, but in an unoccupied section the signal propagates as far as the opposite track section boundary where it is received by a track circuit receiver and analysed by apparatus, which is the subject of the present description, and if the section carrier frequency is positively detected a corresponding output is generated to pick-up a section occupancy relay.

The basic carrier signal may be modulated by an identity code signal and, in addition or alternatively, the carrier signal may be modulated by a signal representing, for example, maximum vehicle speed. As a further check that the track circuit is functioning correctly and is not subjected to unacceptable levels of interference, for example, by other track section signals a threshold level test may be performed. These checks can be readily carried out utilizing the transform results produced by the apparatus being described. One advantage of the invention, and a feature of a fast Fourier transform processor in this context, is that all track circuit hardware may be constructed identically in virtually all major respects. Each transmitter is set to operate at a predetermined track circuit frequency and the only change needed to match a "standard" receiver to a particular transmitter is the selection of an appropriate anti-alias filter.

Figure 1B:
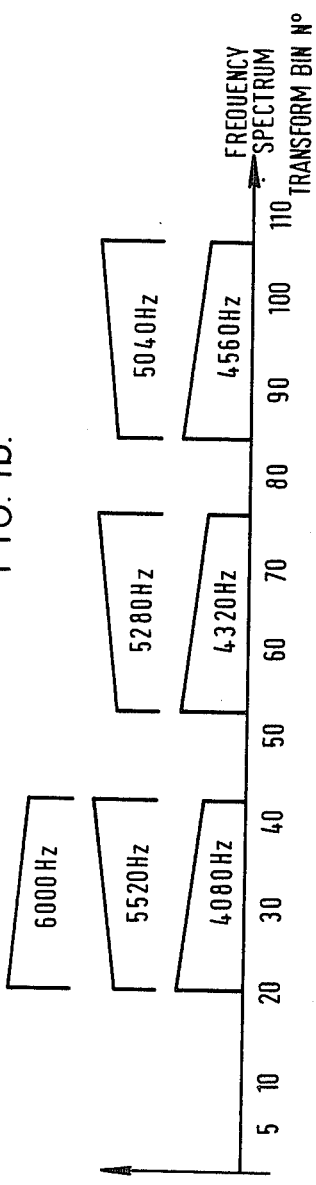
Figure 2:
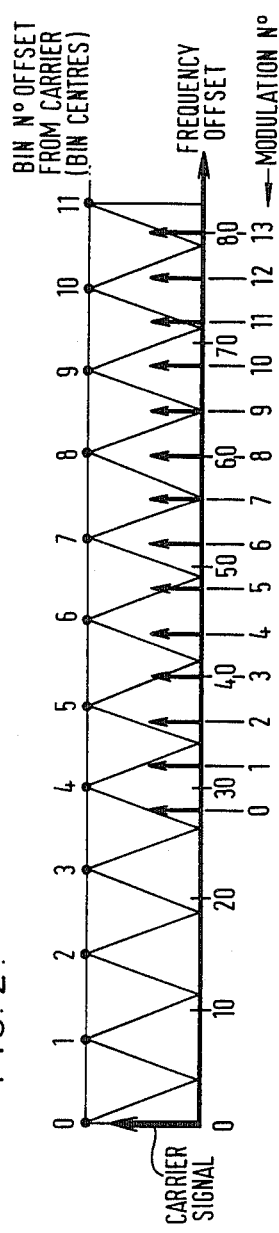
Figure 3:
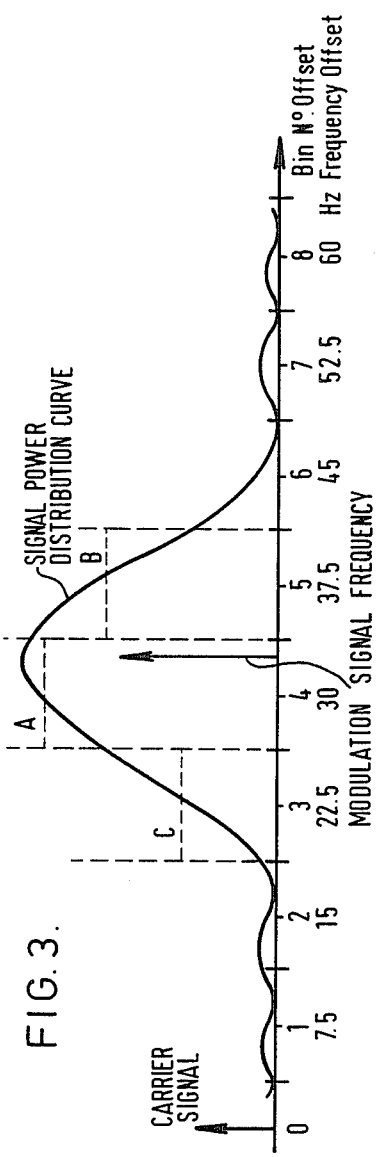
Figure 4:
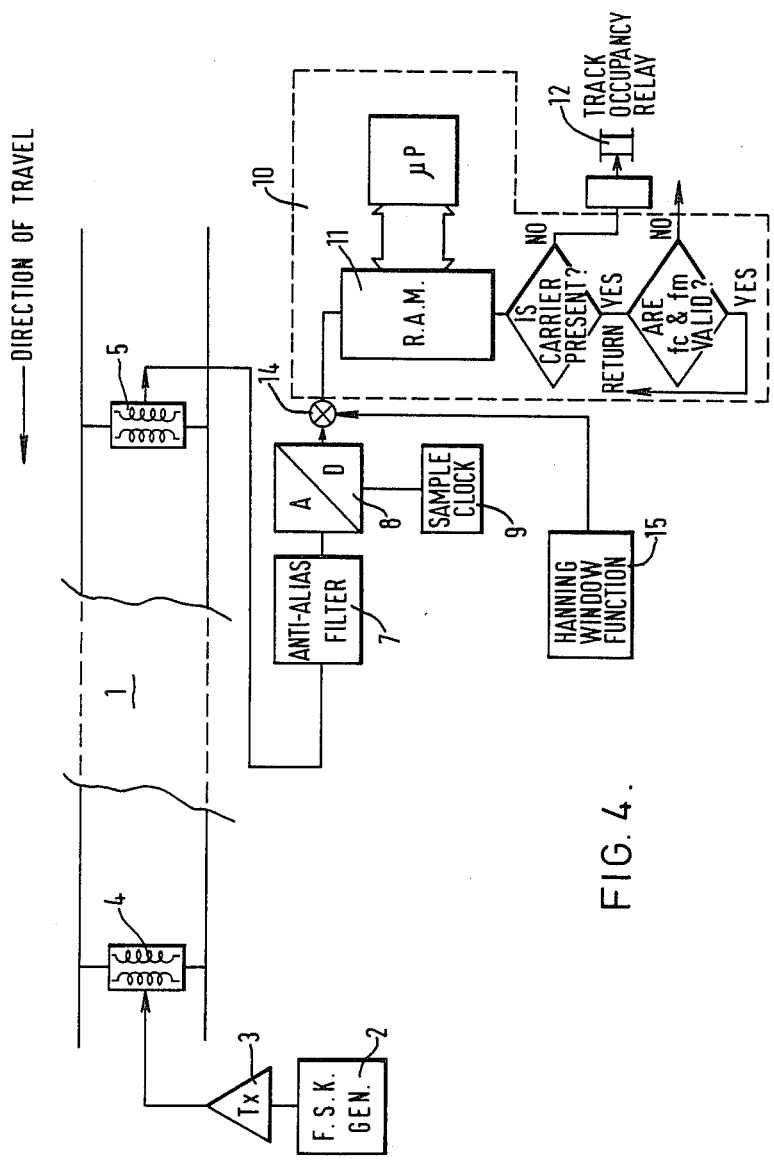

The invention and how it may be carried into effect will now be described in greater detail, by way of example only, with reference to an embodiment illustrated in the accompanying drawings, in which:

FIG. 1(a) shows a frequency spectrum diagram of the carrier frequencies of the exemplary track circuit relative to same frequency multiples and an alias filter response, FIG. 1(b) illustrates the effective folding of the frequency spectrum of FIG. 1(a) caused by "undersampling", FIG. 2 illustrates the modulation frequency spectrum relative to the transform result frequency bins, FIG. 3 illustrates the effective spreading of power of a spot frequency over several adjacent bins in the transform results, and FIG. 4 shows a functional block diagram of a track circuit embodying the invention.

The exemplary embodiment of the invention comprises a railway track circuit arrangement, the equipment of which is illustrated by FIG. 4 and will be described in detail below. Knowledge of the basic form of a track circuit arrangement is assumed. In the embodiment, the track circuit operates using a modulated audio-frequency carrier signal. There are several alternative carrier frequencies and no two adjacent circuits oprate at the same frequency. There are also several alternative modulation frequencies which may or may not change, from time to time, depending upon application. The modulation frequencies can be used to convey information, e.g. a maximum speed limit, to a moving train or in the simplest form merely represent additional and constant identifying codes for the track circuits The available carrier frequencies for main line track circuits, are:
1699.2 Hz
2001.6 Hz
2299.2 Hz
2601.6 Hz The available carrier frequencies for metro or mass transit line track circuits are:
4080 Hz
4320 Hz
4560 Hz
5040 Hz
5280 Hz
5520 Hz
6000 Hz Generally, metro line track circuit carrier frequencies are relatively higher than those for main lines because of the generally shorter track circuit distances involved.

The available modulation frequencies for track circuits with fixed modulation codes and for main line track circuits are:
13.2 Hz
15.6 Hz
18.0 Hz
20.4 Hz On metro line track circuits, a greater number of modulation frequencies are permitted in the range 28 Hz to 80 Hz at intervals of 4 Hz.

A track circuit transmitter is set to operate at a particular nominal carrier frequency and is shift keyed by a selected modulation frequency.

The collective frequency spectrum of track circuit arrangements for metro line use and having the above carrier and modulation operating frequencies is illustrated diagrammatically in FIG. 1a.

A block diagram of the corresponding track circuit equipment is shown in FIG. 4, in which a railway track is indicated at 1. A track circuit signal generator 2, comprises a frequency shift keyed signal generator in which two crystal oscillators are switched alternately, to provide the transmitter signal, at a modulation frequency defined by a third oscillator or by an external code generator. A track circuit signal transmitter 3 is connected to a tuning unit transformer 4, situated at one end of a track circuit section. At the opposite end of the section a similar tuning unit 5 is connected to the input of an anti-alias filter 7 to an analogue to digital sampling circuit 8. The circuit 8 is operated at a predetermined sampling rate set by a sampling rate clock 9, effectively a clock pulse generator. The digitised output samples from the circuit 8, provide real valued time series samples of a received signal which are passed for analysis to a microprocessor, generally indicated at 10, and loaded into its data memory comprising random access memory 11.

The microprocessor 10 performs an analysis of a received signal by evaluating a fast Fourier transform algorithm, for which the digital data samples stored in memory 11 provide initial data. A received signal is transformed from the time domain to the frequency domain and then the frequency components present in the signal are determined by applying a threshold test to each of the frequency bins in the transform results and determining, inter alia, if a valid carrier frequency is present and if a valid modulation frequency is present. These tests are represented by appropriately labelled logic blocks in FIG. 4.

The results of the tests to detect carrier and modulation frequencies control energisation of a track occupancy relay 12. In order for relay 12 to be "picked-up", i.e. energised, and thus to indicate an unoccupied track section, the correct carrier frequency and a valid modulation code must be positively identified. If the correct carrier frequency is not detected, then the track section is deemed to be occupied and the track occupancy relay 12 is not energised.

The purpose of these checks and tests in the track receiver equipment is two-fold: firstly, to determine whether or not the track section monitored is occupied or unoccupied, and secondly, to check correct operation of the track circuit transmitter, and signalling equipment connected to it, so as to constantly monitor the integrity of the system and thereby maintain the safety of a railway vehicle. In this way "wrong side" failures are discovered virtually instantaneously by the equipment itself and without involving the presence of or compromising the safety of a railway vehicle and its passengers.

Returning now to FIG. 1a, the frequency response or transfer characteristic of an anti-alias filter 7 for a 4080 Hz carrier signal is shown superimposed on the frequency chart of the metro carrier frequencies, and multiples of the sampling rate of circuit 8, i.e. the frequency of sample clock 9, are also indicated for comparison. The sampling rate is 1920 Hz. The filter 7 has a frequency bandwidth of 960 Hz equal to half the sample frequency of clock 9. It is important to have an anti-alias filter in the signal path so that any signal which could produce a frequency component, or an alias, within the signal spectrum of interest is excluded.

Conventional sampling theory states that a sampling rate equal at least to twice the highest signal frequency present is required to accurately and unambiguously represent the signal. In the present case, the sampling rate is less than half the lowest carrier signal frequency and if it were not for the anti-alias filter 7 the effect of this would be to fold the frequency spectrum about frequency points equal to multiples of half the sampling rate. This folding effect of the frequency spectrum about half multiples of the sampling rate (carrier signals at 4080 Hz, 5520 Hz, and 6000 Hz appear superimposed, carrier signals at 4320 Hz and 5280 Hz are superimposed, and signals at 4560 Hz and 5040 Hz are superimposed) is illustrated in FIG. 1b, with reference to the frequency bin numbering of a 256 point Fourier transform.

FIG. 2 shows the location of the modulation frequencies in the transformation results spectrum. The carrier signal is represented in frequency bin No. 0 and all possible upper sideband modulation components are represented offset from the carrier in frequency bins correspondingly numbered. It will be appreciated from the diagram that the eleven frequency bins on either side of a carrier signal may contain any one of fourteen modulation signals.

As shown in FIG. 2, some frequency bins may contain an indication of the presence of more than one modulation frequency. Since the transformation results show only the calculated total power in each frequency bin, it is not immediately apparent which one of two such modulation frequencies is present. However, as mentioned earlier, when a frequency is offset from a bin centre frequency, a degree of spreading is observed in the calculated power for that frequency bin. The effect of this signal power spreading over adjacent frequency bins is illustrated in FIG. 3.

An offset signal to be identified lies at a frequency within the limits of bin No. 4. Due to the signal power distribution curve, although the greatest proportion of signal power is present in bin 4 a significant amount lies within bins 3 and 5 on either side.

The signal frequency is identified by calculating the ratio of the relative amounts of power in bins 3 and 5, the ratio being proportional to the frequency offset measured from the centre of bin 4. The ratio calculation, in practice, is made using the sum of the corresponding components of the upper and lower sideband spectra in order to eliminate any slight amplitude modulation effect. Representing these summed quantities by the letters A, B and C the ratios $(A-B)/(A+B)$ and $(A-C)/(A+C)$ are calculated and determine precisely the frequency of the signal relative to the bin centre frequency of bin 4. Look-up tables of various ratio values against frequency offset are stored in a read only memory (ROM). The ROM is addressed with a modulation frequency number and a range of ratio values is read out and these are compared with the ratio values calculated from the transform results to determine the offset frequency of the modulation signal.

The data samples provided at the output of analogue to digital converter 8 in FIG. 4 may be multiplied in a digital multiplier 14 by a factor supplied by Hanning window function circuit 15, and the modified data sample loaded into the memory 11. The Hanning circuit 15 may comprise a look-up table in a read only memory (not shown) in which the required multiplication factors are indexed against data sample numbers 1 to 256. As each new data sample is read from the converter 8, by microprocessor 10, it and the corresponding Hanning factor are multiplied together and the result written into the memory 11. The multiplication process may be performed and controlled by the microprocessor 10.

As previously mentioned, with reference to FIG. 3, a given modulated carrier signal has both upper and lower sideband frequency components. It is found in practice that slight frequency errors in frequency generators and tuning offsets of the track circuit equipment result in amplitude modulation of frequency shift keyed carrier signals. This appears as amplitude differences between the upper and lower sideband components, varying in time in anti-phase. As mentioned earlier, the upper and lower sideband values are added together for the ratio test to determine a frequency offset error. The analysing apparatus therefore includes calculating means adapted to carry out the described steps of said ratio test.

However, if the power of one sideband is more than twice the power of the opposite sideband, then the results are unreliable and are rejected. This also ensures that a received signal does, in fact, possess two sidebands. Means are also provided for this test, which may be performed in conjunction with a check of the phase relationship of the upper and lower sidebands. The latter is performed to discriminate between amplitude modulated and frequency modulated signals. These tests may be provided for in the software of a microprocessor connected to analyse the transform results.

In a frequency modulated signal, the phase of the resultant of the sum of the sideband vectors is orthogonal with respect to the phase of the carrier signal. However, for the case of an amplitude modulated signal the phase of that resultant is in-phase with, or in anti-phase with, the carrier signal. Therefore means may be provided in the analysing equipment, operative to calculate the phase of the sum of the sideband components using the phase information calculated in the transform process. The results calculated on received amplitude modulated signals are able to be disqualified, thus ensuring that only those obtained from Frequency Shift Keyed signals are used for control and signalling purposes.

I claim:

1. A method of analysing a signal, for the purpose of identifying its frequency components, by performing a fast Fourier transform on real time series samples of the signal, including, in combination, the steps of filtering to exclude alias frequencies of the signal and sampling the filtered signal at a rate substantially lower than the minimum rate required to unambiguously identify the frequency of the signal.

2. A method according claim 1, wherein the digital sampling rate is no greater than approxmately half the frequency of the lowest expected frequency component of the signal.

3. A method as claimed in claim 1, further including the step of applying a window function to signal samples.

4. Apparatus for performing the method of claim 1, including means for evaluating a fast Fourier transform algorithm, and data collection means for obtaining real time series samples of a signal, which comprises an anti-alias filter having an output connected with digital sampling means operative to sample the filtered signal at a rate substantially lower than the minimum rate required to unambiguously identify the frequency of the signal.

5. Apparatus as claimed in claim 4, wherein the anti-alias filter is a band-pass filter having a bandwidth equal to half the sampling frequency.

6. Apparatus as claimed in claim 5 adapted for identifying a modulated carrier signal, wherein the anti-alias filter has a centre frequency at substantially the same frequency as that of the carrier signal.

7. Apparatus as claimed in claim 4, wherein the data collection means includes means for applying a Hanning window function to the data samples collected during one cycle of the apparatus.

8. Apparatus as claimed in claim 7, wherein the Hanning window means comprises means for multiplying a data sample by factor determined in accordance with a normalised cosine squared periodic function having a half-period equal to one sampling cycle.

9. Apparatus as claimed in claim 1, wherein there is provided means responsive to the transformation results for performing a ratio test to determine a frequency.

* * * * *